(12) United States Patent
Fudge et al.

(10) Patent No.: US 7,436,910 B2
(45) Date of Patent: Oct. 14, 2008

(54) DIRECT BANDPASS SAMPLING RECEIVERS WITH ANALOG INTERPOLATION FILTERS AND RELATED METHODS

(75) Inventors: Gerald L. Fudge, Rockwall, TX (US);
James E. Harvey, Heath, TX (US);
Mark A. Chivers, McKinney, TX (US);
Sujit Ravindran, Dallas, TX (US)

(73) Assignee: L-3 Communications Integrated Systems, L.P., Greenville, TX (US)

( * ) Notice: Subject to any disclaimer, the term of this patent is extended or adjusted under 35 U.S.C. 154(b) by 203 days.

(21) Appl. No.: 11/545,310

(22) Filed: Oct. 10, 2006

(65) Prior Publication Data

US 2008/0013653 A1    Jan. 17, 2008

Related U.S. Application Data

(63) Continuation-in-part of application No. 11/247,338, filed on Oct. 11, 2005, and a continuation-in-part of application No. 11/247,314, filed on Oct. 11, 2005.

(51) Int. Cl.
*H03D 1/00* (2006.01)
(52) U.S. Cl. ..................................... 375/340
(58) Field of Classification Search ................. 375/316, 375/340, 354, 355
See application file for complete search history.

(56) References Cited

U.S. PATENT DOCUMENTS

| | | | | |
|---|---|---|---|---|
| 5,014,018 | A | 5/1991 | Rodwell et al. | 333/20 |
| 5,454,007 | A | 9/1995 | Dutta | 375/78 |
| 6,266,518 | B1 | 7/2001 | Sorrells et al. | 455/118 |
| 6,507,624 | B1 | 1/2003 | Jachim et al. | 375/316 |
| 6,574,459 | B1 | 6/2003 | Kaminski et al. | 455/272 |
| 6,700,388 | B1 | 3/2004 | Mayor et al. | 324/537 |
| 6,900,710 | B2 | 5/2005 | Agoston et al. | 333/248 |
| 7,107,033 | B2 | 9/2006 | du Toit | 455/296 |
| 2002/0161300 | A1 | 10/2002 | Hoff et al. | 600/449 |

(Continued)

OTHER PUBLICATIONS

Arthur, "Modern SAW-based pulse compression systems for radar applications, Part I: SAW matched filters," Electronics & Communication Engineering Journal, Dec. 1995, pp. 236-246.

(Continued)

*Primary Examiner*—David B Lugo
(74) *Attorney, Agent, or Firm*—O'Keefe, Egan, Peterman, & Enders, LLP (57) ABSTRACT

Reconfigurable direct radio frequency (RF) bandpass sampling receivers are disclosed that utilize analog interpolation filters to improve performance. The addition of the analog interpolation filter to the bandpass sampling receiver allows the quantization clock to be de-coupled from the RF sampling clock. As such, the quantization can be performed at a much slower rate than the initial RF sampling allowing the final analog bandwidth to be much narrower than the bandwidth of the first stage filter located before the high-speed sampler. The combination of a tunable bandpass filter, tunable bandpass sample clock and analog interpolation filter followed by a further stage of sampling and quantization at a slower rate than the bandpass sample clocking, therefore, provides significant advantageous by de-coupling the quantization sample rate from the high-speed sample rate. If desired, the analog interpolation filter may also be tunable. Other variations and implementations are also described.

26 Claims, 5 Drawing Sheets

U.S. PATENT DOCUMENTS

| | | |
|---|---|---|
| 2003/0016762 A1 | 1/2003 | Martin et al. ............... 375/308 |
| 2003/0054783 A1 | 3/2003 | Mason et al. ............... 455/307 |
| 2005/0069046 A1 | 3/2005 | Tsui et al. .................. 375/260 |

OTHER PUBLICATIONS

Arthur, "Modern SAW-based pulse compression systems for radar applications, Part II: Practical systems," Electronics & Communication Engineering Journal, Apr. 1996, pp. 57-78.

Brandl et al., "High Speed Signal Processing with Tapped Dispersive SAW based Delay Lines," University of Technology, Applied Electronics Laboratory, Vienna Austria, IEEE 2000, pp. 171-176.

Burke, "Ultra-Linear Chirp Generation Via VCO Tuning Predistortion," AIL Systems, Inc., Deer Park, New York, IEEE 1994 MTT-S Digest, pp. 957-960.

Gerard et al., "The Design and Applications of Highly Dispersive Acoustic Surface-Wave Filters," Invited Paper, IEEE Transactions on Microwave Theory and Techniques, vol. MTT-21, No. 4, Apr. 1973, pp. 176-186.

Ong et al., "Digital LPI Radar Detector," Naval Postgraduate School Thesis, Monterey, California, Mar. 2001, pp. 1-81.

Grant et al., "Recent Advances in Analog Signal Processing," IEEE 1990, IEEE Transactions on Aerospace and Electronic Systems, vol. 26, No. 5, Sep. 1990, pp. 818-849.

Li et al., "On the Use of a Compressive Receiver for Signal Detection," IEEE 1991, IEEE Transactions on Communications, vol. 39, No. 4, Apr. 1991, pp. 557-566.

Levy et al, "VCO Based Chirp Generation for Broad Bandwidth Compressive Receiver Applications," AIL Systems, Inc., Deer Park, New York, IEEE 1993 MTT-S Digest, pp. 1113-1115.

Lucyszyn, "Review of radio frequency microelectromechanical systems technology," Imperial College, London, IEE Proc.-Sci. Meas. Technol.vol. 151, No. 2, Mar. 2004, pp. 93-103.

Lyons et al., "High Temperature Superconductive Wideband Compressive Receivers," Analog Device Technology Group, Lincoln Laboratory, Invited Paper, IEEE Transactions on Microwave Theory and Techniques, vol. 44, No. 7, Jul. 1996, pp. 1258-1278.

Unser, "Sampling—50 Years After Shannon," Swiss Federal Institute of Technology, Lausanne, Switzerland, IEEE 2000 Proceedings of the IEEE, vol. 88, No. 4, Apr. 2000, pp. 569-587.

Sengupta et al, "Novel Ferroelectric Materials for Phased Array Antennas," U.S. Army Research Laboratory, Aberdeen Proving Groud, 1997 IEEE, IEEE Transactions on Ultrasonics, Ferroelectrics, and Frequency Control, vol. 44, No. 4, Jul. 1997, pp. 792-797.

Serhan et al., "Automatic Frequency Control Techniques For Microwave Active Filters," Limoges University, Limoges, France, 1997 IEEE MTT -S Digest, pp. 697-700.

Whittaker et al, "Digital chirp filter processing for improved performance of sweeping spectrum analysers," University of Surrey, Surrey, UK, Electronics Letters, Aug. 3, 2000, vol. 36, No. 16, pp. 1430-1432.

Agoston et al, "100 GHz Through-Line Sampler System with Sampling Rates in Excess of 10 G samples/second," Picosecond Pulse Labs, Boulder, Colorado, PSPL -100 Sampler Paper—Submitted to MTT 2003, http://www.picosecond.com->products->sampler modules, 3 pgs.

Akbari-Dilmaghani et al, "A High Q RF CMOS Differential Active Inductor," Imperial College, London, 1998 IEEE International Conference on Electronics, Circuits and Systems, vol. 3, Sep. 7-10, 1998, pp. 157-160.

Akos et al, "Direct Bandpass Sampling of Multiple Distinct RF Signals," 1999 IEEE Transactions on Communications, Vo. 47, No. 7, Jul. 1999, pp. 983-988.

Behbahani et al, "A Broad-Band Tunable CMOS Channel-Select Filter for a Low-IF Wireless Receiver," 2000 IEEE Journal of Solid-State Circuits, vol. 35, No. 4, Apr. 2000, pp. 476-489.

Brown et al, "Digital L-Band Receiver Architecture with Direct RF Sampling," NAVSYS Corp., Colorado Springs, Colorado, Position Location and Navigation Symposium, 1994, IEEE, Apr. 11-15, 1994, pp. 209-216.

Copeland et al, "5-GHz SiGe HBT Monolithic Radio Transceiver with Tunable Filtering," 2000 IEEE Transactions on Microwave Theory and Techniques, vol. 48, No. 2, Feb. 2000, pp. 170-181.

Deleniv et al, "Tunable Ferroelectric Filter-Phase Shifter," University of Technology, Gothenburg, Sweden, 2003 IEEE MTT-S Digest, pp. 1267-1270.

Juodawlkis et al, "Optical Down-Sampling of Wide-Band Microwave Signals," Invited Paper, Journal of Lightwave Technology, vol. 21, No. 12, Dec. 2003, pp. 3116-3124.

Karvonen et al, "A CMOS Quadrature Charge-Domain Sampling Circuit with 66-dB SFDR Up to 100 MHz," 2005 IEEE Transactions on Circuits and Systems -I: Regular Papers, vol. 52, No. 2, Feb. 2005, pp. 292-304.

Koc et al, "Direct RF Sampling Continuous-Time Bandpass /spl Delta/-/spl Sigma/A/D Converter Design for 3G Wireless Applications," ISCAS 2004, May 23-26, 2004, vol. 1, pp. 409-412.

Latiri et al, "A reconfigurable RF sampling receiver for multistandard applications," Comptes Rendus Physique 7 (2006), pp. 785-793.

Lindfors et al, "A 3-V 230- MHz CMOS Decimation Subsampler," 2003 IEEE Transactions on Circuits and Systems—II: Analog and Digital Signal Processing, vol. 50. No. 3, Mar. 2003, pp. 105-117.

Loper, "A Tri-Phase Direct Conversion Receiver," Rockwell International, MILCOM 1990, Sep. 30-Oct. 3, 1990, pp. 1228-1232.

Luy et al, "Configurable RF Receiver Architecture," Daimler-Chrysler Research and Tecnology, Ulm, Germany, 2004 IEEE Microwave Magazine, Mar. 2004, pp. 75-82.

Minnis et al, "A Highly Digitized Multimode Receiver Architecture for 3G Mobiles," 2003 IEEE Transactions on Vehicular Technology, vol. 52, No. 3, May 2003, pp. 637-653.

Mirabbasi et al, "Classical and Modern Receiver Architectures," University of Toronto, 2000 IEEE Communications Magazine, Nov. 2000, pp. 132-139.

Mostafa et al, "WCDMA Receiver Architecture with Unique Frequency Plan," Micro Lnear Corp. San Jose, California and Texas Instruments, Inc., Dallas, Texas, ASIC/SOC Conference, 2001 Proceedings, 14th Annual IEEE International, Sep. 12-15, 2001, pp. 57-61.

Muhammad et al, "Direct RF Sampling Mixer With Recursive Filtering in Charge Domain," Texas Instruments Incorporated, Dallas, Texas, ISCAS, May 23-26, 2004, vol. 1, pp. 577-580.

Namgoong et al., "Direct-Conversion RF Receiver Design," 2001 IEEE Transactions on Communications, vol. 49, No. 3, Mar. 2001, pp. 518-529.

Pellon, "RF-to-Digital Receivers Employing Bandpass Multibit /spl Sigma//spl Delta/ ADC Architectures," Lockheed Martin Government Electronic Systems, Morristown, New Jersey, 20th Annual Gallium Arsenide Integrated Circuit (GaAs IC) Symposium, Nov. 1-4, 1998, pp. 11-14.

"Real-Time Sampling Downconverter Front Ends for Digital Radar and Wide-Bank Signaling," Picoscond Pulse Labs, 2500 55th Street, Boulder, CO 80301, (Nov. 2004).

Richter et al, "An Integrated Wideband-IF-Receiver Architecture for Mobile Terminals," Dresden University of Technology, Dresden, Germany, 2003 IEEE Radio Frequency Integrated Circuits Symposium, Jun. 8-10, 2003, pp. 583-586.

Shoji et al, "70-GHz-Band MMIC Transceiver With Integrated Antenna Diversity System: Application of Receive-Module-Arrayed Self-Heterodyne Technique," 2004 IEEE Transactions on Microwave Theory and Techniques, vol. 52, No. 11, Nov. 2004, pp. 2541-2549.

Springer et al, "RF System Concepts for Highly Integrated RFICs for W-CDMA Mobile Radio Terminals," 2002 IEEE Transactions on Microwave Theory and Techniques, vol. 50, No. 1, Jan. 2002, pp. 254-267.

Tatu et al, "Ka-Band Direct Digital Receiver," 2002 IEEE Transactions on Microwave Theory and Techniques, vol. 50, No. 11, Nov. 2002, pp. 2436-2442.

Tayebati et al, "Microelectromechanical tuneable filters with 0.47 nm linewidth and 70nm tuning range," Electonics Letters, Jan. 8, 1998, vol. 34, No. 1, pp. 76-78.

Thor et al, "A Direct RF Sampling Multifrequency GPS Receiver," Stanford University, Position Location and Navigation Symposium, 2002 IEEE, Apr. 15-18, 2002, pp. 44-51.

Tsui et al, "Digital Microwave Receiver Technology," Invited Paper, 2002 IEEE Transactions on Microwave Theory and Techniques, vol. 50, No. 3, Mar. 2002, pp. 699-705.

Valkama et al., "Advanced Receiver Architectures and I/Q Signal Processing," Tampere University of Technology, Tampere, Finland, First International Symposium on Control, Communications and Signal Processing, IEEE Jun. 2004, pp. 71-74.

Vaughan et al, "The Theory of Bandpass Sampling," 1991 IEEE Transactions on Signal Processing, vol. 39, No. 9, Sep. 1991, pp. 1973-1984.

Wooten et al, "Rapidly Tunable Narrowband Wavelength Filter Using LiNbO3 Unbalanced Mach-Zehnder Interferometers," Journal of Lightwave Technology, vol. 14, No. 11, Nov. 1996, pp. 2530-2536.

Pepper et al, "NLTLs Push Sampler Products Past 100 GHz," Microwaves & RF, Oct. 2005, 6 pgs.

Model 7620 DCSM VME Card Datasheet, Revision C, Picosecond Pulse Labs, Boulder, Colorado, Sep. 2005, 10 pgs.

Wepman, "Analog-to-Digital Converters and Their Applications in Radio Receivers," 1995 IEEE Communications Magazine, May 1995, pp. 39-45.

U.S. Appl. No. 60/373,163, filed Apr. 17, 2002, "Tunable modules for frequency agile receivers."

PCT International Search Report, PCT/US2006/039615, Apr. 2, 2007.

PCT International Application No. PCT/US06/39506 "*International Search Report,*" Oct. 10, 2006.

DIRECT BANDPASS SAMPLING RECEIVERS WITH ANALOG INTERPOLATION FILTERS AND RELATED METHODS

RELATED APPLICATIONS

This application is a continuation-in-part application of the following two co-pending applications: U.S. patent application Ser. No. 11/247,338 entitled "RECONFIGURABLE DIRECT RF BANDPASS SAMPLING RECEIVER AND RELATED METHODS," which was filed on Oct. 11, 2005, and U.S. patent application Ser. No. 11/247,314 entitled "SWEPT BANDPASS FILTER FREQUENCY MODULATED CONTINUOUS WAVE (FMCW) RECEIVER AND RELATED METHODS," which was filed on Oct. 11, 2005, the entire text and all contents for each of which is hereby expressly incorporated by reference in its entirety.

This application is also related in part to the subject matter described in the following concurrently filed patent applications: U.S. patent application Ser. No. Ser. No. 11/545,642, entitled "NYQUIST FOLDED BANDPASS SAMPLING RECEIVERS AND RELATED METHODS," and U.S. patent application Ser. No. 11/545,641, entitled "NYQUIST FOLDED BANDPASS SAMPLING RECEIVERS WITH NARROW BAND FILTERS FOR UWB PULSES AND RELATED METHODS," the entire text and all contents for each of which is hereby expressly incorporated by reference in its entirety

TECHNICAL FIELD OF THE INVENTION

This invention relates to receiver architectures for the efficient sampling of radio frequency (RF) signals and, more particularly, to receiver architectures for the efficient sampling of signals over a wide frequency range of interest.

BACKGROUND

A wide variety of signals and related protocols exist for the use of radio frequency (RF) signals in communication systems and other devices, such as radar systems. RF signals of interest, however, can occur across a wide range of center frequencies with various bandwidths and can have relatively small signals compared to background noise. As such, it is desirable for an RF receiver to be designed to acquire and allow the detection and measurement of signals across a wide frequency range with various bandwidths while contributing little distortion, spurs or interference from its own circuitry. For a electronic intelligence application, for example, the desired signals to be acquired and detected can fall within a frequency range from less than 2 GHz to greater then 20 GHz. To provide reasonable sensitivity against a variety of signal types and bandwidths while maximizing search coverage, typical instantaneous search bandwidths may range from 100 MHz or less to 1 GHz or greater. For communications systems, for example, the desired signals to be received can fall within a frequency range from less than 100 MHz to greater than 5 GHz, with instantaneous bandwidths ranging from less than 100 kHz to over 100 MHz.

Many receiver architectures currently exist for receiving RF signals. These architectures include heterodyne receivers, homodyne receivers (also called zero-IF and direct conversion receivers for intermediate frequency (IF) applications), low-IF receivers, double conversion wideband IF receivers, wideband digital receivers, 6-port receivers (a special case of homodyne receivers), 3-phase variations of homodyne receivers, charge-domain direct RF mixer-sampler receivers, compressive receivers, noise-shaping sigma-delta receivers, non-reconfigurable direct RF optical down-sampling receivers, bandpass sampling variations of heterodyne receivers, and optical tuned channelized filters for fiberoptic WDM (wavelength division multiplexed) receivers. In addition, multi-signal bandpass sampling receivers combining the outputs from multiple bandpass filters without tuning have been proposed. In addition, noise-shaping sigma delta converters that use a bank of bandpass filters to implement a tuning function with a modulation sampling clock meeting the Nyquist criteria for the total frequency range of interest have been designed. In addition, direct RF receivers based on the use of analog high-speed pre-samplers have been built, although not in any reconfigurable architecture. Still further, combination architectures have been utilized such as a combination of switched homodyne receiver and low-IF receiver architectures. Each of these prior architectures suffer certain disadvantages and, therefore, have not been entirely effective in receiving RF signals, particularly in applications requiring large degrees of reconfigurability where the frequency range of interest is very large and extends to many GHz and the instantaneous bandwidth of interest may vary, such as electronic intelligence applications and multi-mode communications receivers.

SUMMARY OF THE INVENTION

Direct radio frequency (RF) bandpass sampling receivers are disclosed that utilize analog interpolation filters to improve performance. The addition of the analog interpolation filter to the bandpass sampling receiver allows the quantization clock to be de-coupled from the RF sampling clock. As such, the quantization can be performed at a much slower rate than the initial RF sampling allowing the final analog bandwidth to be much narrower than the bandwidth of the first stage filter located before the high-speed sampler. The combination of a tunable bandpass filter, tunable bandpass sample clock and analog interpolation filter followed by a further stage of sampling and quantization at a slower rate than the bandpass sample clocking, therefore, provides significant advantageous by de-coupling the quantization sample rate from the high-speed sample rate. If desired, the analog interpolation filter may also be tunable, and the sampling clock may be tunable or selectable. The receiver architectures disclosed can be used to cover extremely large RF ranges (e.g., from less then 2 GHz to greater than 20 GHz) and are suitable for a variety of signal applications, including electronic intelligence and multi-mode communications. As described in more detail below, a variety systems and methods can be utilized as part of the present invention.

In one embodiment, receive path circuitry is disclosed for a bandpass sampling receiver having decoupled quantization, including bandpass filter circuitry having a center frequency within a frequency range of interest and having a bandwidth less than the frequency range of interest, non-quantizing sampling circuitry configured to receive a filtered signal from the bandpass filter circuitry and to receive a bandpass sampling clock signal as an input where the bandpass sampling clock signal meets Nyquist sampling criteria of the bandpass filter but does not meet Nyquist sampling criteria of the total frequency range of interest, an analog interpolation filter coupled to receive the output of the non-quantizing sampling circuitry where the analog interpolation filter has a center frequency within a Nyquist zone of operation for the non-quantizing sampling circuitry, and analog to digital converter (ADC) circuitry configured to receive a quantization sampling clock signal and to quantize an analog signal received from the analog interpolation filter. In addition, the analog interpolation filter can be a tunable analog interpolation filter having a center frequency that is tunable within a Nyquist zone of operation for the non-quantizing sampling circuitry, and the bandpass filter circuitry can be a tunable bandpass filter circuitry having a tunable center frequency dependent upon a filter control signal where the center frequency is tunable across the frequency range of interest. Still further, the quantization sampling clock signal can be tunable to determine a Nyquist zone of operation for the ADC.

In a further embodiment, the receiver circuitry further includes clock generation circuitry coupled to provide the sampling clock signal to the non-quantizing sampling circuitry where the clock generation circuitry is configured to generate at least two selectable sampling clock signals and where each sampling clock signal is configured to correspond to a different frequency so that Nyquist boundaries associated with the first sampling clock signal are different from the Nyquist boundaries associated with the second sampling clock signal. Still further, the first sampling clock signal can be configured such that a plurality of Nyquist boundaries associated with the first sampling clock signal fall within the frequency range of interest, and the second sampling clock signal can be configured such that a plurality of Nyquist boundaries associated with the second sampling clock signal fall within the frequency range of interest. In addition, the clock generation circuitry can be configured to select the second sampling clock signal when the bandwidth for the bandpass filter circuitry includes a Nyquist boundary for the first sampling clock signal.

In another embodiment, the receiver circuitry further includes second non-quantizing sampling circuitry configured to receive a signal from the analog interpolation filter and to receive a second bandpass sampling clock signal as an input where the second bandpass sampling clock signal meets Nyquist sampling criteria of the bandpass filter but does not meet Nyquist sampling criteria of the total frequency range of interest, and a second analog interpolation filter coupled to receive the output of the second non-quantizing sampling circuitry where the second analog interpolation filter has a center frequency within a Nyquist zone of operation for the second non-quantizing sampling circuitry. In addition, the analog to digital converter (ADC) circuitry is configured to receive a quantization sampling clock signal and to quantize an analog signal received from the second analog interpolation filter. Still further, the ADC circuitry can include a zero-IF down-conversion circuitry configured to mix the signal from the analog interpolation filter down to baseband and to produce digital baseband real (I) and imaginary (Q) path signals. The zero-IF down-conversion circuitry can further include real (I) and imaginary (Q) path reconfigurable low pass filters and real (I) and imaginary (Q) path analog to digital converters (ADCs).

In another embodiment, a method is disclosed for direct sampling of signals including utilizing a bandpass filter to filter a signal within a frequency range of interest where the bandpass-filter has a bandwidth less than the frequency range of interest, bandpass sampling a filtered signal from the bandpass filter circuitry without quantizing the signal according to a sampling clock signal that meets Nyquist criteria for the bandpass filter but does not meet Nyquist criteria for the total frequency range of interest, filtering the signal with an analog interpolation filter having a center frequency within a Nyquist zone of operation, and quantizing a signal received from the analog interpolation filter. In addition, the method can include tuning a center frequency of the analog interpolation filter within a Nyquist zone of operation for the non-quantizing sampling circuitry, and the method can include tuning a center frequency of the bandpass filter circuitry across the frequency range of interest. The method can also include tuning the quantization sampling clock signal to determine a Nyquist zone of operation for the ADC.

In another embodiment, the method can include generating at least two selectable sampling clock signals for the bandpass sampling where each sampling clock signal can be configured to correspond to a different frequency so that Nyquist boundaries associated with the first sampling clock signal are different from the Nyquist boundaries associated with the second sampling clock signal. In addition, the method can include configuring a first sampling clock signal such that a plurality of Nyquist boundaries associated with the first sampling clock signal fall within the frequency range of interest, and further configuring the second sampling clock signal such that a plurality of Nyquist boundaries associated with the second sampling clock signal fall within the frequency range of interest. Still further, the method can include selecting the second sampling clock signal when the bandwidth for the bandpass filter circuitry includes a Nyquist boundary for the first sampling clock signal.

In yet another embodiment, the method can include bandpass sampling the filtered signal from the analog interpolation filter without quantizing the signal according to a second sampling clock signal that meets Nyquist criteria for the bandpass filter but does not meet Nyquist criteria for the total frequency range of interest, and filtering the signal with a second analog interpolation filter having a center frequency within a Nyquist zone of operation prior to the quantizing step. Still further, the quantizing step can include tuning the signal from the analog interpolation filter to zero-IF, generating analog baseband real (I) and imaginary (Q) path signals, and quantizing the analog baseband real (I) and imaginary (Q) path signals to produce digital baseband real (I) and imaginary (Q) path signals. The method can further include filtering the analog real (I) and imaginary (Q) path with reconfigurable low pass filters and digitizing real (I) and imaginary (Q) signals with analog to digital converters (ADCs).

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

Reconfigurable direct radio frequency (RF) bandpass sampling receivers are disclosed herein that utilize analog interpolation filters to improve performance. The addition of the analog interpolation filter to the bandpass sampling receiver allows the quantization clock to be de-coupled from the RF sampling clock. As such, the quantization can be performed at a much slower rate than the initial RF sampling allowing the final analog bandwidth to be much narrower than the bandwidth of the first stage filter located before the high-speed sampler. The combination of a tunable bandpass filter, tunable bandpass sample clock and analog interpolation filter followed by a further stage of sampling and quantization at a slower rate than the bandpass sample clocking, therefore, provides significant advantageous by de-coupling the quantization sample rate from the high-speed sample rate.

Figure 1:
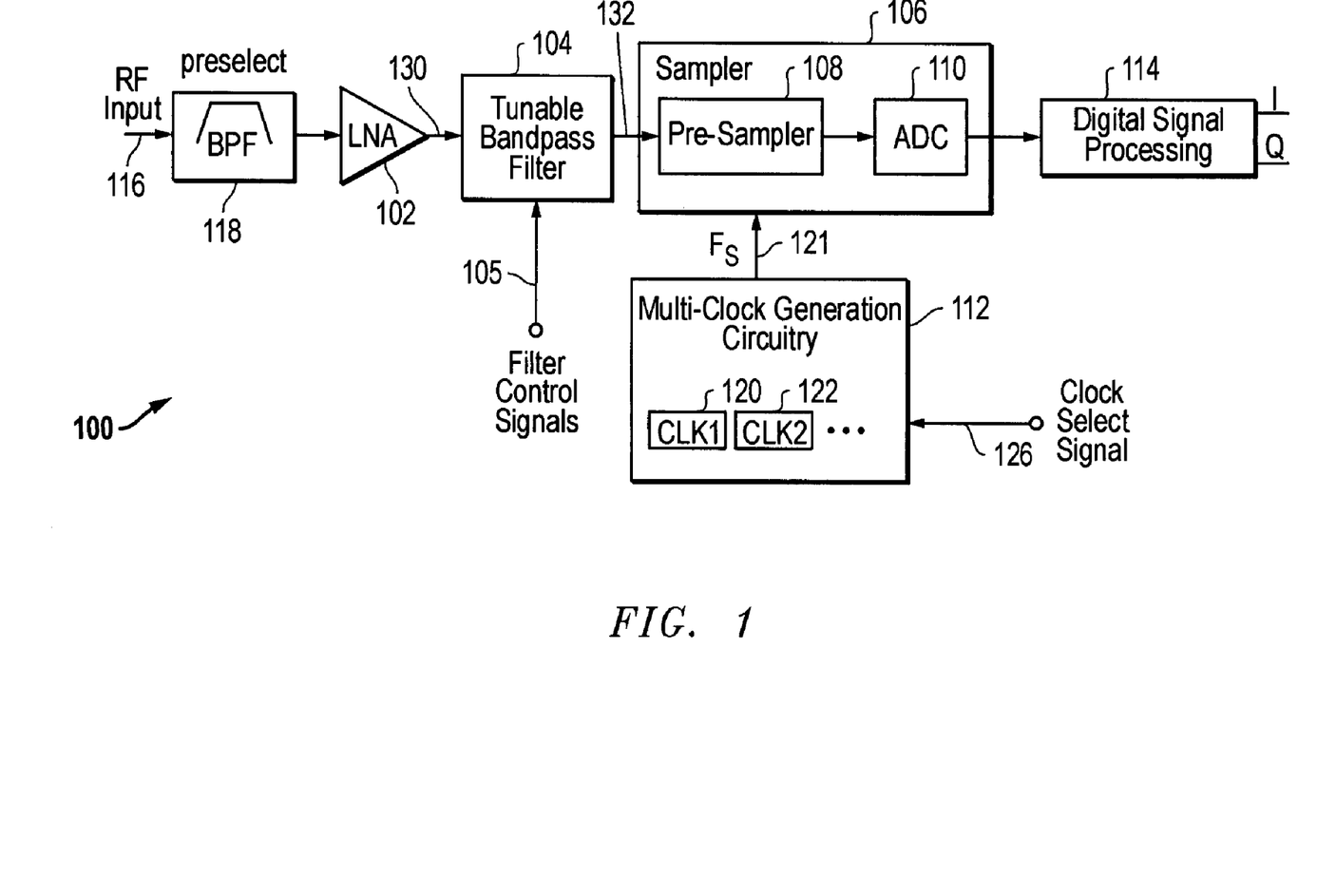
FIG. 1 is a block diagram of an embodiment for a reconfigurable direct radio-frequency (RF) sampling receiver.

Initially, a reconfigurable direct radio frequency (RF) bandpass sampling receiver is discussed with respect to FIG. 1. This reconfigurable direct radio frequency (RF) bandpass sampling receiver is also described in U.S. patent application Ser. No. 11/247,338 entitled "RECONFIGURABLE DIRECT RF BANDPASS SAMPLING RECEIVER AND RELATED METHODS," which was filed on Oct. 11, 2005, which is hereby incorporated by reference in its entirety. Associated receiver architectures that additional take advantage of an analog interpolation filter are then discussed with respect to FIGS. 2A, 2B, 3, 4, 5 and 6.

The reconfigurable RF bandpass sampling receiver of FIG. 1 and the analog interpolation filter embodiments of FIGS. 2A, 2B, 3, 4, 5 and 6 are all effective receiver architectures. The reconfigurable direct RF bandpass sampling receiver of FIG. 1 is particularly advantageous for ELINT type systems and also for receiving wideband signals, more generally. For example, this RF bandpass sampling receiver can be used to detect wideband signals, such as those having a bandwidth of about a few hundred MHz to about 1 GHz or more with the bandwidth being about 5% to 15% of the RF center frequency. The RF bandpass sampling receiver can also have a relatively large tuning range (e.g., from about 2 to 20 GHz). However, this RF bandpass sampling receiver will likely have a moderate dynamic range because, as discussed below, the ADC in this embodiment will typically need to be clocked as fast as RF pre-sampler circuitry is clocked. In addition, the RF pre-sampler and the ADC will often both have to run fast enough to avoid aliasing problems.

In addition to being advantageous for ELINT type systems, the embodiments utilizing analog interpolation filters, as discussed with respect to FIGS. 2A, 2B, 3, 4, 5 and 6 below, are also advantageous for receivers in communication systems. In these embodiments, the analog interpolation filter acts in operation as an anti-aliasing filter for the ADC. This means that the bandwidth for the receiver can be extremely narrow, if desired. These embodiments, therefore, are particularly useful for communications receivers having narrow bandwidth and high dynamic range requirements. In addition, these embodiments are useful for receiver implementations needing large tuning range requirements, such as is often the case for some multi-mode communications systems, because these embodiments can be more effective at lower frequencies and at higher frequencies than the embodiment of FIG. 1.

Looking now to FIG. 1, a reconfigurable direct radio frequency (RF) bandpass sampling receiver is described that provides direct RF sampling of an input signal spectrum passed through a bandpass filter that is tunable over a wide frequency range of interest and which is sampled based on the bandwidth of the filter rather than the bandwidth of the total frequency range of interest. The bandwidth of the filter may further be variable to provide for optimized search against a variety of signal bandwidths. The reconfigurable direct RF bandpass sampling receiver may be implemented with a single fixed clock for applications where the signals of interest lie in adjacent non-overlapping frequency channels. For applications requiring arbitrary tuning, the reconfigurable direct RF bandpass sampling receiver can also use a programmable or switched sampling clock to avoid the Nyquist sample boundaries that occur with bandpass sampling and thus provide sampling of arbitrary frequencies. A high-speed analog pre-sampler may be included to extend the maximum frequency range that can be sampled. In an electronic intelligence (ELINT) application, this reconfigurable direct RF bandpass sampling receiver architecture provides a method for achieving a much smaller receiver form factor than previously achieved. This architecture also provides a way to achieve better spur performance with less phase noise by tuning the filter, instead of tuning the RF signal, and then by performing bandpass sampling (i.e., sampling at a non-DC frequency). The optional use of two or more clock sampling frequencies (i.e., Fs1, Fs2 . . . ) is also described, and these selectable and/or tunable sampling clock signals allow adjustment of the Nyquist boundaries which occur at integer multiples of Fs/2.

Although direct RF down-sampling receivers using optical technology have been used, these receivers convert a fixed section of RF bandwidth and are not tunable. Although direct RF bandpass sampling receivers have been proposed, no solution has been presented in prior art to allow direct RF bandpass sampling with tuning over a wide frequency range of interest. Although sampling with switched bandpass filters to implement adjacent channel tuning in a Nyquist-sampled sigma delta architecture has been used, this architecture is fundamentally limited in tuning to higher RF frequencies because of the need for the modulation clock to meet Nyquist sampling criteria for the maximum frequency; furthermore this architecture does not provide arbitrary tuning. In addition, direct RF receivers based on the use of analog high-speed pre-samplers have been built, although not in any reconfigurable architecture. The reconfigurable direct RF bandpass sampling receiver architecture effectively combines aspects of other architectures into a particularly advantageous solution. This architecture is particularly advantageous for applications requiring a wide range of center frequencies extending to very high frequencies such as where signal frequencies are in a range from 2 GHz or lower to 10 or 20 GHz and higher. As such, this receiver architecture is advantageous for us in wide frequency range of interest ELINT receiver implementations.

FIG. 1 is a block diagram of an embodiment 100 for a direct radio-frequency (RF) bandpass sampling receiver. As depicted, the radio frequency (RF) input signal 116 is first passed through an optional pre-select bandpass filter (BPF) 118 and then to a low noise amplifier (LNA) 102. The output 130 of the LNA 102 is provided to a tunable bandpass filter 104, which can be configured to have a tunable center frequency and a programmable bandwidth dependent upon one or more filter control signals 105. The filtered output signal 132 is received by sampler or sampling circuitry 106, which can include a high speed analog pre-sampler 108 and analog-to-digital converter (ADC) circuitry 110. The digital output signals from sampling circuitry 106 are then further processed by digital signal processing (DSP) circuitry 114 to produce baseband in-phase path (I) and quadrature path (Q) signals. The sampler 106 receives a sampling clock (Fs) input signal 121 at a desired sampling frequency. This sampling clock (Fs) signal 121 determines the sampling frequency for the sampling circuitry 106.

This sampling clock (Fs) input signal 121 can be generated by multi-clock generation circuitry 112. As depicted, the multi-clock generation circuitry 112 generates two or more clock signals that can be selected and used as sampling clocks (CLK1, CLK2 . . . ) for the sampling clock signal 121 that is provided to sampling circuitry 106. As shown, two or more clock signals can be generated by the multi-clock generation circuitry 112, namely, a first clock signal (CLK1) 120, a second clock signal (CLK2) 122, and any number of additional clock signals, as desired. A clock select signal 126 is provided to the multi-clock generation circuitry 112 to select which of the clock signals will be used as the output clock signal for the sampling clock signal (Fs) 121 to the sampling circuitry 106. It is also noted that multi-clock generation circuitry 112 could be implemented using a wide variety of clock circuits. For example, the multi-clock generation circuitry 112 could be configured to always generate multiple clocks from which a sampling clock is selected. Alternatively, the multi-clock generation circuitry 112 could be configured to generate a single output clock signal that is adjusted according to the clock select signal 126 to provide a programmable clock output signal at the desired sampling frequency. Other variations could be provided, as desired. It is also noted that in some embodiments a single clock signal could be utilized, if desired. In such an implementation, the clock generation circuitry 112 would provide a single fixed sampling clock output signal for the sampling circuitry 106.

As described herein, it is noted that these different clock signals allow for selection of an appropriate sampling clock based on meeting the Nyquist criteria of the bandpass filter and based on criteria so as to avoid Nyquist sampling problems due to Nyquist boundaries. Nyquist zones are determined by the sampling rate for the sampling circuitry 106, and Nyquist criteria locate sampling zone boundaries at integer (K=0, 1, 2, 3 . . . ) multiples of $f_S/2$ starting at DC (frequency=0 Hz). In addition, Nyquist zones alternate between non-inverted and inverted spectrums. Traditional Nyquist criteria states that for bandpass sampling, the sampling rate must be two-times or greater than the bandwidth of the signal frequency range of interest, and that for baseband sampling, the sampling rate must be two-times or greater than the maximum frequency for the signal frequency range of interest.

As frequency ranges within the signal input spectrum are analyzed, depending upon the sampling frequency for the sampling circuitry 106, one or more Nyquist boundaries could be crossed during processing. Thus, by having multiple sampling clock signals available, when a Nyquist boundary for a first sampling clock signal is being reached during processing across a frequency range, a switch can be made to using a second sampling clock signal. As such, the Nyquist boundary will also change based upon this new sampling frequency. In operation, therefore, if the tunable bandpass filter 104 is tuned to a new frequency and its bandwidth includes a Nyquist boundary, a switch could be made to an alternative sampling frequency so that reconstruction problems at the Nyquist boundaries can be avoided. Thus, with proper selection of the sampling clock signals, the respective Nyquist zone boundaries for these sampling clock frequencies can be made far enough apart so that Nyquist sampling problems for the first sampling clock can be avoided by switching to the second sampling clock, and vice versa. In addition, as indicated above, the present invention is not limited to two clock signals, and any number of selectable clock signal frequencies could be provided, as desired.

The reconfigurable direct RF bandpass sampling receiver architecture has a number of advantages. As a direct RF receiver architecture, the receiver 100 can receive high frequency signals without using a mixer to down-convert the incoming RF signal. Instead, the receiver 100 relies upon aliased bandpass sampling within the sampling circuitry 106 in conjunction with the tunable filter 104 to directly down-convert the received signals. To allow sampling of very high frequency RF signals, a high-speed analog pre-sampler may be used. Because this receiver does not utilize a mixer, it avoids phase noise, spurs and mixer products that typically result from generating a local oscillator (LO) mixing signal and mixing it with the incoming RF signal. This receiver can also have faster response times in changing frequency because it does not need the LO to settle. In addition, the receiver uses less hardware and allows for a smaller form factor because no mixer and no tuner are utilized. It is also noted that the clock performance for the clock generation circuitry is preferably tight in order to avoid ADC jitter errors. Again, the multiple clock signals that can be utilized for the sampling clock signal (Fs) 121 are provided to help avoid non-recoverable zones around Nyquist boundaries as the tunable filter 104 is adjusted across a frequency band of interest for incoming signals 116. Because tunable bandpass filters are used, the reconfigurable direct RF bandpass sampling receiver can receive frequencies across a wide range of frequencies, unlike previously used optical-based direct RF down-sampling receivers. When implemented with multiple clocks, the reconfigurable direct RF bandpass sampling receiver can furthermore tune to arbitrary frequencies across a wide range of frequencies.

Example circuitry that may be utilized for the sampling circuitry 106 includes pre-samplers available from PICOSECOND PULSE LABS (PSPL) to allow sampling by an ADC in cases when the frequency of the signal is above the effective bandwidth of the ADC. Example circuitry that may be utilized for the tunable filter 104 includes tunable filter banks available from PARATEK. If desired, other tunable filter technologies could be utilized, such as tunable optical Mach-Zehnder filter technology, tunable image rejection notch filters, tunable bandpass filters based on active inductor technology, tunable filter that use thin film ferroelectric varactors to provide voltage controlled phase shifting, and tunable filters the use RF microelectromechanical systems (MEMS) technology.

Looking back to FIG. 1, it is noted that the preselect filter 118 is optional component (depending on application) to suppress frequencies outside the range of interest. It is also noted that the LNA 102 can be used to increase the gain to within range of the sampling circuitry 106 given any insertion losses of the tunable filter 104, and the LNA 102 can be used to provide for a desired noise figure response. The LNA 102 can be implemented as desired, and the specific implementation for the LNA 102 will be technology and application dependent. In addition, the functionality of the LNA 102 may be split between different component, as desired (e.g., the gain may be spread to optimize for a specific cascade analysis). In some strong signal applications, an LNA may not be required.

The tunable filter 104 can be implemented as a narrowband filter that can be tuned over the frequency range of interest. For ELINT applications, the low end of the frequency range might be from 500 MHz to 2 GHz and the high end of the frequency range might be over 20 GHz. A typical instantaneous bandwidth of the tunable filter could be anywhere from 5% to 15% or more of the center frequency, or the tunable filter could be configured to have an instantaneous bandwidth ranging from 25 MHz to over 1 GHz. The tuning can be implemented via continuous tuning (e.g., a voltage controlled dielectric) or by closely spaced switched filter banks, or by a combination of continuous tuning and switched filter banks. Other implementations could also be used, if desired. Regardless of how the tuning is implemented, the basic form of the reconfigurable direct RF bandpass sampling receiver is characterized by the ability to perform bandpass sampling (i.e., sampling at non-DC frequencies) with arbitrary center frequency over a large RF range of center frequencies. It is noted that if the instantaneous bandwidth approaches a large fraction of the center RF frequency, then the benefits of the reconfigurable direct RF bandpass sampling receiver over full bandwidth sampling will likely decrease. In a possibly limiting case, the instantaneous bandwidth equals the full range of the frequency range of interest, and no tuning is required for the tunable filter 104. At this point, the reconfigurable direct RF bandpass sampling receiver becomes similar to a direct RF bandpass sampling receiver.

The sampler 106 can be a module that inputs the band-limited RF signal and performs analog to digital conversion. The sampler module may include a high-speed analog pre-sampler 108 configured to capture the signal prior to being processed by a sample-and-hold circuit of a typical analog to digital converter (ADC) to allow sampling by an ADC in cases when the frequency of the signal is above the effective bandwidth of the ADC. The ADC 110 can follow the pre-sampler 108. It is noted that the sampler module may be fully integrated and that for some applications the pre-sampler may not be required.

The DSP 114 can include additional digital processing for the received signals. For example, the DSP 114 can include filtering, decimation, conversion of the real sampled data to in-phase/quadrature-phase (I/Q) data, equalization, signal detection, and signal measurement. Additional post-processing DSP functions required by the specific application can also be integrated into the DSP 114, as desired, for the reconfigurable direct RF bandpass sampling receiver.

It is noted that there are key differences between all prior bandpass sampling techniques and the reconfigurable direct RF bandpass sampling receiver. One important difference is that this receiver architecture uses a tunable bandpass filter 104 that can tune to many different Nyquist zones. A second important difference is that this receiver architecture can be tuned to any arbitrary frequency between the minimum and maximum frequency range. To help achieve this result while covering multiple Nyquist zones, the receiver architecture utilizes a second clock. By using a second clock, the reconfigurable direct RF bandpass sampling receiver shifts the Nyquist boundary to a different location, allowing recovery of signals on the Nyquist boundary of the first clock. Prior solutions do not allow a continuous range of frequency coverage that crosses multiple Nyquist boundaries.

The reconfigurable direct RF bandpass sampling receiver allows the flexibility of a reconfigurable heterodyne receiver with wideband frequency coverage without any oscillator-based tuning hardware, thus reducing cost, size, weight, and power (CSWAP) and improving performance in spur performance, tuning speed, and phase noise. In addition, the reconfigurable direct RF bandpass sampling receiver has better dynamic range and improved CSWAP than receivers with instantaneous bandwidth equal to the full frequency range (such as wideband compressive receivers and full bandwidth digitizers). For typical wireless applications with frequency range under a few GHz, the reconfigurable direct RF band-pass sampling receiver has similar advantages as a RF noise shaping sigma delta digital receiver. However, as the maximum frequency of interest increases, the reconfigurable direct RF bandpass sampling receiver is advantageous over the RF noise shaping sigma delta digital receiver because the modulator sampling clock of the RF noise shaping digital receiver is constrained by the Nyquist criteria of the maximum frequency and thus must be at least twice the maximum frequency. Thus for applications such as ELINT/EW/ESM, the reconfigurable direct RF bandpass sampling receiver is, therefore, superior to the RF noise shaping sigma delta digital receiver.

It is noted that the reconfigurable direct RF bandpass sampling receiver also uses bandpass sampling, and there are a few key differences between all of prior bandpass sampling receivers and the reconfigurable direct RF bandpass sampling receiver. One important difference is that the reconfigurable direct RF bandpass sampling receiver uses a tunable bandpass filter that can tune to many different Nyquist zones. A second important difference is that the reconfigurable direct RF bandpass sampling receiver can be tuned to any arbitrary frequency between the minimum and maximum frequency range. In order to achieve this result while covering multiple Nyquist zones, the reconfigurable direct RF bandpass sampling receiver can use a second sampling clock so that the signal can be reconstructed at the Nyquist boundaries. By using a second clock, the reconfigurable direct RF bandpass sampling receiver effectively shifts the Nyquist boundary to a different location, allowing recovery of signals on the Nyquist boundary of the first clock. Prior solutions do not allow such a continuous range of frequency coverage crossing multiple Nyquist boundaries. The multi-signal bandpass sampling concept is limited partially by the fact that the filters are not reconfigurable, but more importantly, the filters are severely constrained in design to avoid overlapping aliased signal spectra. Thus, the reconfigurable direct RF bandpass sampling receiver more flexible than multi-signal bandpass sampling utilized in prior solutions.

Filter control signal 105 is typically used to set the tunable bandpass filter to a particular frequency and bandwidth and is stationary for a period of time before being reconfigured. Alternatively, the filter control signal 105 could be smoothly or rapidly changing (time-varying) in frequency and/or bandwidth similar to the swept bandpass filter receiver described in more detail in U.S. patent application Ser. No. 11/247,314 entitled "SWEPT BANDPASS FILTER FREQUENCY MODULATED CONTINUOUS WAVE (FMCW) RECEIVER AND RELATED METHODS," which was filed on Oct. 11, 2005, and which is hereby expressly incorporated by reference in its entirety. In the reconfigurable direct RF bandpass sampling receiver, however, the time-varying filter avoids having Nyquist boundaries inside the filter bandwidth. Nyquist boundaries may be avoided in the time-varying case by configuring the filter bandwidth to be less than the bandwidth of the particular Nyquist zone (i.e., bandpass region of interest) so that as the filter center frequency changes, the filter bandwidth is always within a single Nyquist zone, or they may be avoided by tuning to separate Nyquist zones while avoiding the boundaries by use of appropriate center frequency and filter bandwidth, or they may be avoided by time-varying the clock appropriately, or through a combination of these techniques. It is noted that in the case where the clock is time-varying to allow the time-varying filter to avoid Nyquist boundaries, signal reconstruction may be difficult, and thus a smoothly or rapidly changing (time-varying) clock would typically be avoided.

Because the physical architecture of the reconfigurable direct RF bandpass sampling receiver is similar to the physical architecture of the swept bandpass filter FMCW receiver, in principle the reconfigurable direct RF bandpass sampling receiver could be modified to function as a swept bandpass filter FMCW receiver by allowing the filter to be time-varying and by allowing the filter to cross Nyquist boundaries and by suitable modification of the DSP. Similarly, the swept bandpass filter FMCW receiver could, in principle, be modified to function as a single-clock embodiment of the direct RF bandpass sampling receiver by discrete tuning the frequency/bandwidth (rather than time-varying) or by appropriate choice of clock so that Nyquist boundaries are avoided as the filter sweeps, and by suitable modification of the DSP to allow reconstruction of the captured time-frequency bandwidth. It is noted that because of typical component limitations, a combined functionality receiver for either direct RF bandpass sampling and/or swept bandpass FMCW receiver would not perform as well and/or would cost significantly more; thus while a combined receiver could, in principle be built, this would not represent best practice. The swept bandpass FMCW receiver provides the best benefit as an IF receiver with a wide-band front-end tuner reducing the RF frequency to the low GHz range with the DSP optimized for detection and measurement of wide bandwidth FMCW signals, while the direct RF bandpass sampling receiver provides the best benefit as an RF receiver operating over a wide range of frequencies from the low GHz range to 20 GHz and above with the DSP optimized for general purpose signal reconstruction, detection, and measurement.

Figure 2A:
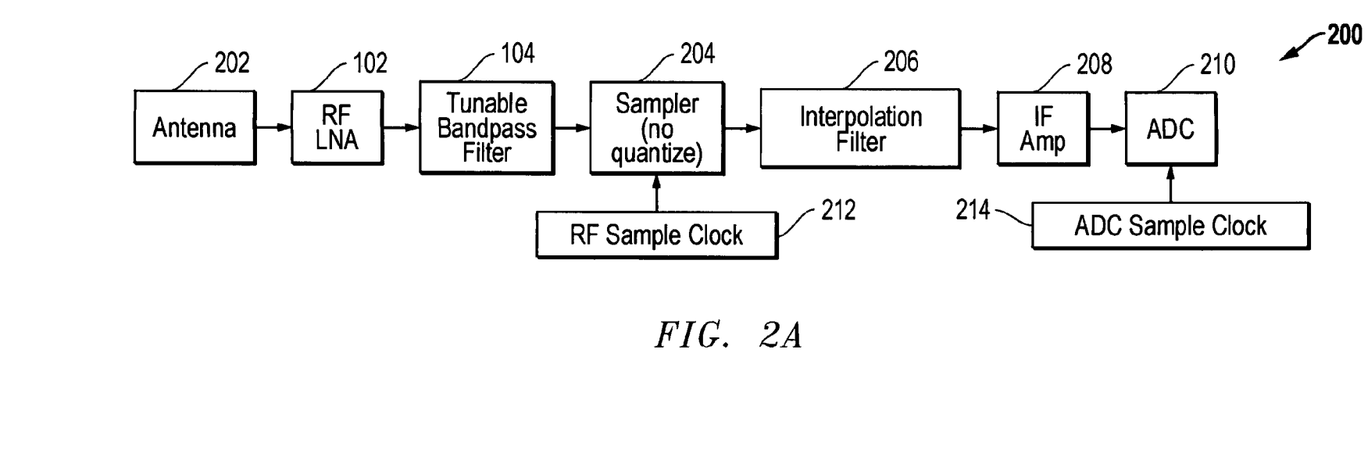
FIG. 2A is a block diagram for an example embodiment of a reconfigurable direct RF bandpass sampling receiver with an analog interpolation filter.
Figure 2B:
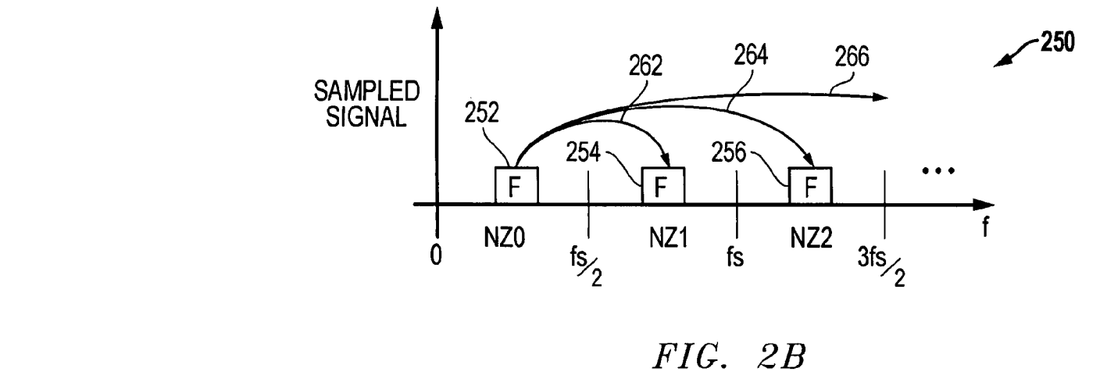
FIG. 2B is a Nyquist zone diagram related to the operation of the analog interpolation filter.

Bandpass receiver architectures that utilize an analog interpolation filter are now discussed with respect to FIGS. 2A, 2B, 3, 4, 5 and 6. In particular, FIG. 2A provides a further embodiment where an analog interpolation filter is added to the reconfigurable direct RF bandpass sampling receiver discussed with respect to FIG. 1. FIG. 2B is a Nyquist zone diagram associated with architecture of FIG. 2A. FIGS. 3-6 then provide further variations and implementations of the reconfigurable direct RF bandpass sampling receiver architecture using an analog interpolation filter.

As discussed above, the embodiment 100 of FIG. 1 provides for the use of multiple clocks and/or one or more tunable clocks by sampler 106 such that the operation of the pre-sampler 108 and the ADC 110 can avoid Nyquist zone boundaries. The clock generation circuitry is tuned, or one of multiple generated clock signals is selected, so that a desired clock signal is output by the multi-clock generation circuitry 112. In part, the embodiment 100 provides a solution that allows for a much smaller form factor for applications requiring extremely wide tuning bandwidth. It also provides a way to achieve better spur performance by tuning the filter instead of timing the RF signal and then performing bandpass sampling with a second clock to allow adjustment of the Nyquist boundaries (which occur at integer multiples of Fs/2). One potential problem with the embodiment 100 of FIG. 1, however, is that the pre-sampler 108 can act as a type of extended sample-and-hold for the analog-to-digital converter (ADC) 110 so that the quantization rate of the ADC 110 will equal the RF bandpass sample rate of the pre-sampler 108. This implies that the digital signal processing (DSP) 114 will be interacting with a switchable or tunable sampling clock signal ($F_S$) 121. In addition, it may be difficult to use a slower-speed high-dynamic-range ADC because the RF bandpass sample rate will typically be high. A high RF bandpass sample rate is preferred in general because the dynamic range of the RF bandpass sampling is greater and because this allows a wider transition region for the tunable or switchable filter 104 thereby simplifying the filter design. Another problem caused by the requirement for synchronous sampling is that in implementations where the pre-sampler 108 and ADC 110 are separate physical devices (which is typically the case for sampling for high frequency RF signals with current technology) is that precision delays must typically be used. For example, a delay can be added to a common clock signal used by the pre-sampler 108 and the ADC 110 in order to provide for synchronous sampling.

FIG. 2A provides an embodiment where an analog interpolation filter is added to the reconfigurable direct RF bandpass sampling receiver discussed with respect to FIG. 1. The addition of the analog interpolation filter allows the ADC clock to be de-coupled, and potentially completely de-coupled, from the RF sample clock. Thus, this modification of the architecture of FIG. 1 allows the quantization to be performed at a much slower rate than the initial sampling and allows the final analog bandwidth to be much narrower than the bandwidth of the first stage filter located before the high-speed sampler. The combination of a tunable bandpass filter, tunable bandpass sample clock and analog interpolation filter followed by a further stage of sampling and quantization at a slower rate than the bandpass sample clocking provides significant advantageous by de-coupling the quantization sample rate from the high-speed sample rate. As with the embodiment 100 of FIG. 1, the embodiment 200 of FIG. 2 provides a simplified receiver architecture capable of covering extremely large RF ranges (e.g., from less then 2 GHz to greater than 20 GHz) and suitable for a variety of signal applications including electronic intelligence (ELINT) signal applications with typical instantaneous bandwidth of 5% to 15% of the center frequency. Further, the addition of the narrower analog interpolation filter also allows arbitrarily narrow instantaneous bandwidth for various applications including communications and narrow-band searching.

Looking now in more detail to FIG. 2A, a block diagram is depicted for an example embodiment 200 of a reconfigurable direct RF bandpass sampling receiver with an analog interpolation filter 206. The overall receiver architecture for embodiment 200 is similar to that for embodiment 100 of FIG. 1. However, the functionality of the sampler 106 of FIG. 1, which included pre-sampler 108 and ADC 110, has been implemented as a non-quantizing sampler 204, an analog interpolation filter 206, intermediate frequency (IF) amplifier 208 and ADC 210. The non-quantizing sampler 204 receives a RF sampling clock signal from RF sample clock circuitry 212, and the ADC 210 receives a quantization sampling clock signal from ADC sample clock circuitry 214. Because the ADC 210 has been de-coupled from the non-quantizing sampler 204 through the analog interpolation filter 206, the RD sample clock signal and the ADC sample clock signal can be different.

As further depicted in FIG. 2, the antenna 202 provides an RF input signal to the RF low noise amplifier (RF LNA) 102. This amplified signal is then provided to the tunable bandpass filter 104, which is discussed above. The signal is then processed by the non-quantizing sampler 204, passed through the analog interpolation filter 206, and then digitized with ADC 210. As shown, an additional amplifier 208 can be provided before the ADC 210 which amplifies the output of the analog interpolation filter 206 and is configured to operate at the intermediate frequency (IF) output by the analog interpolation filter 206.

Numerous advantages are achieved through the addition of the analog interpolation filter 206 between the high-speed non-quantizing sampler 204 and the ADC 210. This implementation allows the quantization sample rate of the ADC 210 to be de-coupled, and potentially completely de-coupled, from the RF bandpass sample rate of the non-quantizing sampler 204. In particular, in comparison with embodiment 100 of FIG. 1, the embodiment 200 of FIG. 2 allows the quantization in ADC 210 to occur at a much slower rate than the rate of the ADC 110 and sampler 108 within the sampler 106 of FIG. 1.

It is noted that the analog interpolation filter 206 is a filter having bandwidth less than or equal to the Nyquist bandwidth of the high-speed non-quantizing sampler 204 in order to help provide smooth interpolation. This interpolation greatly facilitates the de-coupling of the high-speed RF sample rate of the non-quantizing sampler 204 from the quantization sample rate of the ADC 210. It is also noted that the analog interpolation filter 206 is different in function from a wideband IF (intermediate frequency) filter that could be placed at the output of a high-speed sampler 106 in FIG. 1 in order to help stretch the pulse as part of a sample-and-hold process. Such a wideband IF filter for purposes of stretching the pulse has been used, for example, with respect to pre-samplers available from PICOSECOND PULSE LABS (PSPL).

FIG. 2B is a Nyquist zone diagram related to the operation of the analog interpolation filter. As depicted, the diagram 250 represents the sampled signal versus frequency and shows the Nyquist zones created based upon the RF sampling rate ($F_S$) from the RF sample clock 212. In particular, a baseband Nyquist zone (NZ0) is created between zero and $F_S/2$. A first Nyquist zone image (NZ1) is created between $F_S/2$ and $F_S$. A second Nyquist zone image (NZ2) is created between $F_S$ and $3F_S/2$, and so on. The quantization sample clock for the ADC 210 can then be operated to determine the Nyquist zone from which the signals will be quantized. The filter response for the analog interpolation filter 206 is represented as filter response (F) 252 in the baseband Nyquist zone (NZ0). The filter response then also imaged into each Nyquist zone image as represented by arrows 262, 264 and 266. As shown, the analog interpolation filter 206 is seen as filter response (F) 254 in the first Nyquist zone image (NZ1), as filter response (F) 256 in the second Nyquist zone image (NZ2) 256, and so on. With respect to the quantization sample clock for ADC 210, the quantization sample clock could be made to be fixed for applications in which the desired frequency range can be received without tuning the quantization sample clock. If desired, the quantization clock for the ADC 210 could also be implemented as a tunable clock signal to provide greater flexibility in overall system tuning to frequencies of interest. For example, the quantization clock would typically be implemented as a tunable clock if the ADC 210 is performing bandpass sampling and if the interpolation filter is tunable in order to properly perform bandpass sampling. On the other hand, if the interpolation filter is tunable in a hybrid architecture with an RF tuning element after the interpolation filter, then the quantization clock sample rate would typically be determined by the bandwidth requirements and not the bandpass sampling requirements.

In operation, the embodiment 200 of FIG. 2A provides the advantage of de-coupling the high-speed sampling and quantization processes by using an analog interpolation filter after the bandpass sampling and before the quantization. As such, the sampling and quantization can be completely de-coupled from the RF bandpass sampling process, if desired, and the Nyquist zone within which the ADC 210 operates can be selected as shown with respect to FIG. 2B. In prior bandpass sampling, the sampling/quantization process is typically performed at the same time as the RF sampling, with most of the power requirements tied to the quantization function rather than the RF sampling function. The analog interpolation filter provides significant advantages including simplifying the ADC timing, simplifying the DSP processing of the quantized output signals, reducing total power consumption, allowing for a high-dynamic range ADC to be used, allowing for tunable bandpass sampling at an intermediate frequency (IF), and allowing for multi-stage bandpass sampling.

One reason to use a tunable quantization sampling clock is when the ADC 210 is doing bandpass sampling of the output of the interpolation filter 206. In this case, two sets of Nyquist zones are considered: the Nyquist zones generated by the RF bandpass sampling non-quantizing sample clock (the RF Nyquist zones) and the Nyquist zones generated by the ADC bandpass sampling quantizing sample clock (the ADC Nyquist zones). If the RF bandpass sampling non-quantizing sample clock is changed, then different RF frequencies will come through the interpolation filter 206. This action, therefore, performs some amount of tuning. If you move the interpolation filter 206 over a single ADC Nyquist zone, but within the same RF Nyquist zone, then different RF frequencies will come out of the interpolation filter 206 and into the ADC 210 without changing the ADC bandpass sampling quantizing sample clock. This action, therefore, also performs some amount of tuning. The two tuning operations together provide more tuning flexibility than would available with either tuning operation alone. If you move the interpolation filter 206 over a partial ADC Nyquist zone, but within the same RF Nyquist zone, then for proper bandpass sampling, you will typically need to also change your ADC sample rate. This action effectively re-adjusts the locations of the ADC Nyquist zones. This action also performs tuning. The combination of this tuning action with the other tuning actions above provides even more flexibility in tuning. This flexibility in tuning means that more degrees of freedom are provided in the receiver design and operation.

Tuning flexibility can also be achieved by having any sort of hybrid architecture utilizing any desired tuning circuitry after the interpolation filter 206. Examples of such additional tuning circuitry includes utilizing circuitry to achieve a zero-IF backend (described below), a low-IF backend, a double conversion wideband IF backend, a tunable noise shaping sigma-delta receiver backend, and/or any other desired backend circuitry. Although the zero-IF backend hybrid architecture is discussed below with respect to FIG. 6, others can be used. With the analog interpolation filter 206, a regular IF (intermediate frequency) output is provided out of the interpolation filter 206. This IF output signal can then be further processed with any desired conversion or other circuitry, including a bandpass sampling ADC circuitry and/or zero-IF down-conversion circuitry. In these cases, operations in the same RF Nyquist zone is typically used. Operations in different RF Nyquist zones could be used. It is not clear, however, what advantages there would be in doing so, unless it was desired to operate in the upper part of the first RF Nyquist zone instead of the lower part of the baseband RF Nyquist zone with everything else in the baseband Nyquist zone.

Figure 3:
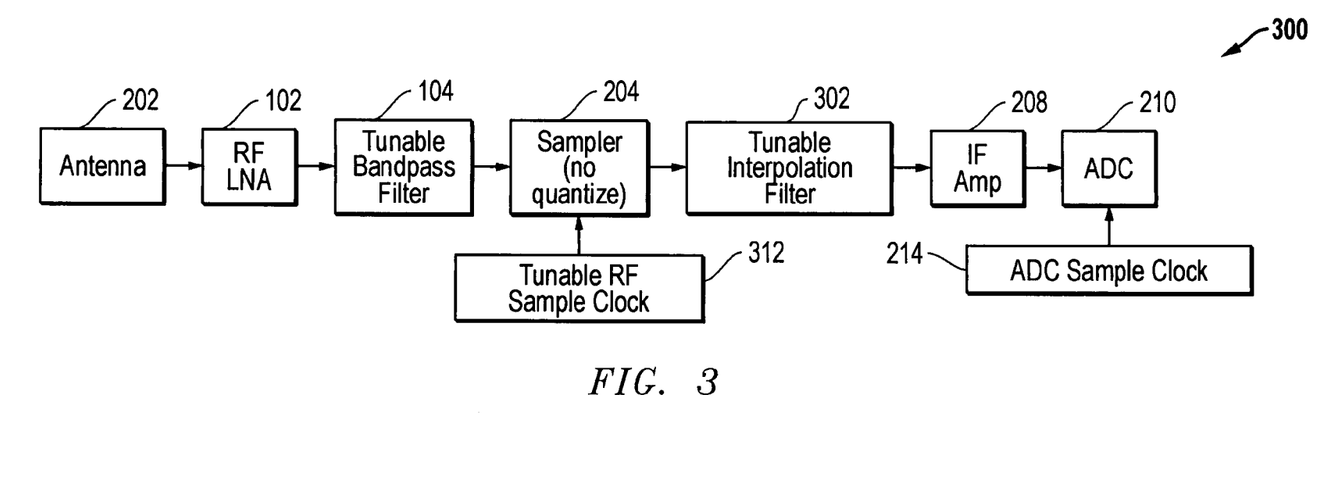
FIG. 3 is a block diagram for an example embodiment of a reconfigurable direct RF bandpass sampling receiver with a tunable analog interpolation filter.
Figure 4:
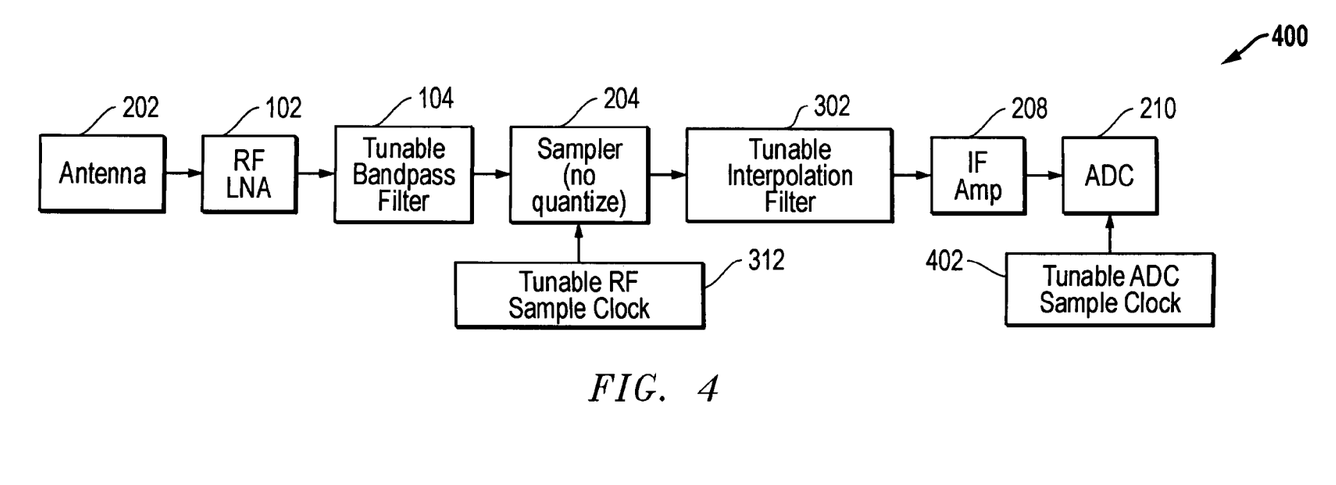
FIG. 4 is a block diagram for an example embodiment of a reconfigurable direct RF bandpass sampling receiver with a tunable analog interpolation filter and a tunable ADC sample clock.
Figure 5:
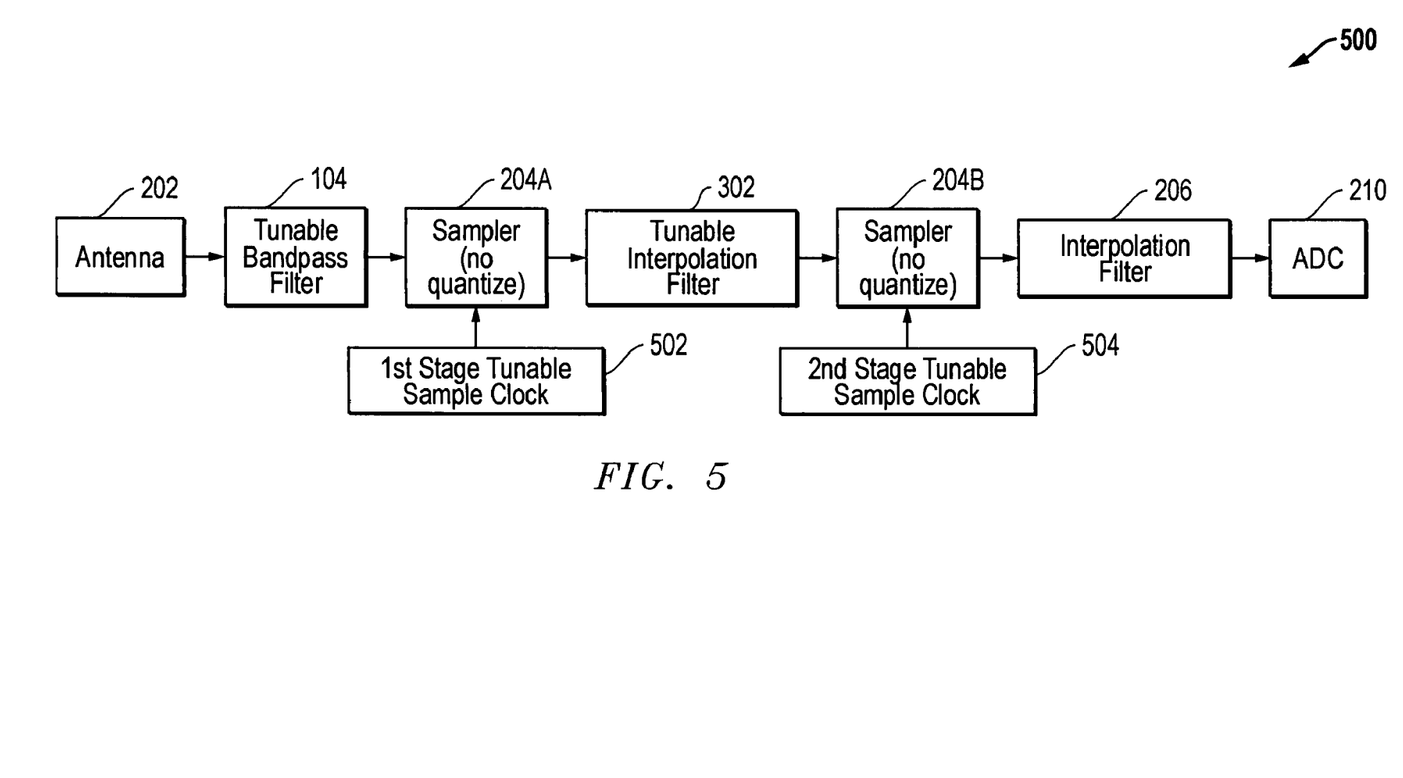
FIG. 5 is a block diagram for an example embodiment of a reconfigurable direct RF bandpass sampling receiver with multi-stage analog interpolation filter (amplifiers not shown).
Figure 6:
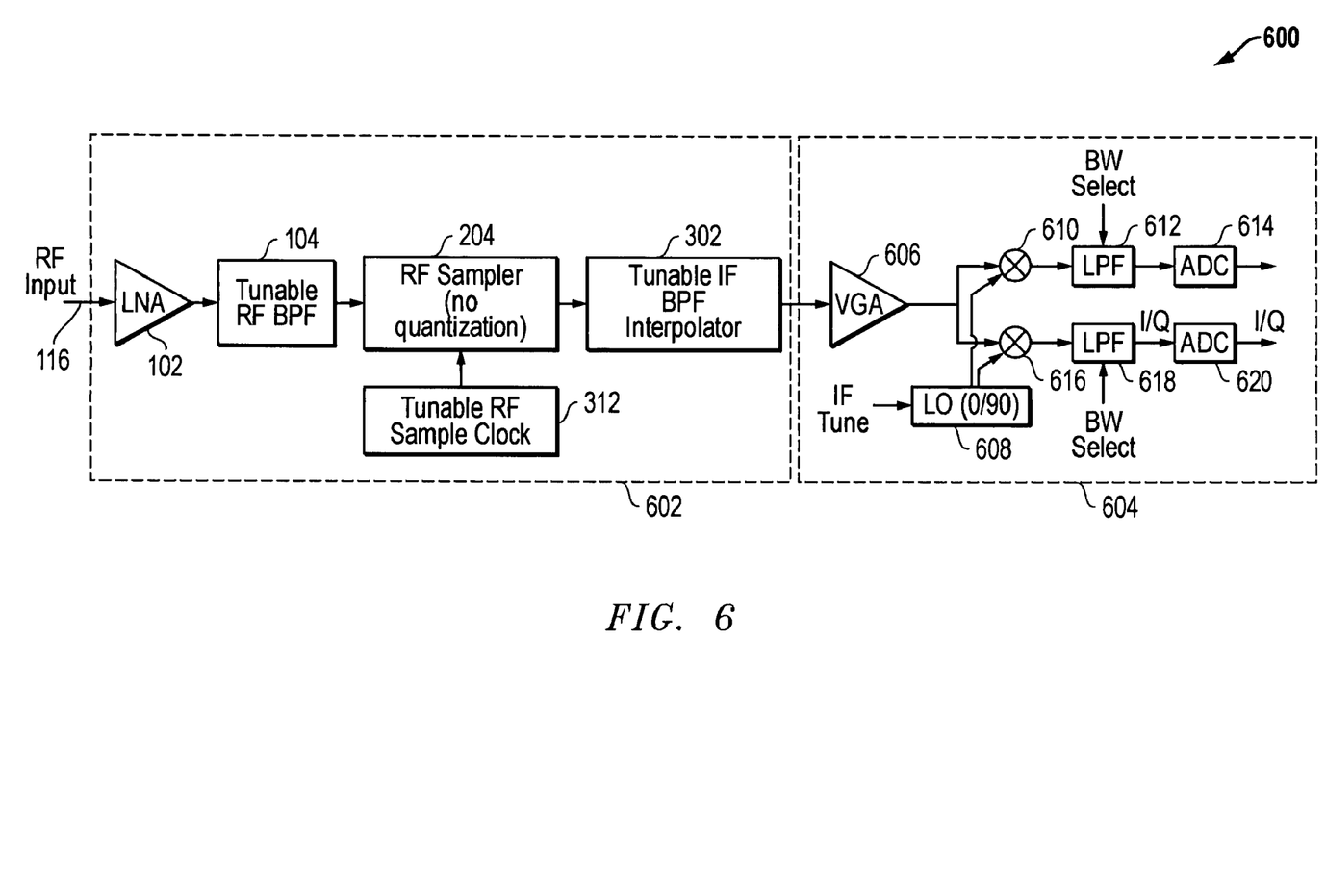
FIG. 6 is a block diagram for an example embodiment of a reconfigurable direct RF bandpass sampling receiver with a tunable bandpass analog interpolation filter and a zero-IF backend.

FIGS. 3-6 provide additional example embodiments for further variations on the architecture in FIG. 2A using an analog interpolation filter. FIG. 3 depicts an embodiment utilizing a tunable interpolation filter. FIG. 4 depicts an embodiment further using a tunable quantization sample clock. FIG. 5 depicts a multi-stage embodiment related to FIG. 4. And FIG. 6 depicts an embodiment utilizing a hybrid architecture with the addition of a direct down-conversion block at the backend.

FIG. 3 is a block diagram for an example embodiment 300 of a reconfigurable direct RF bandpass sampling receiver with a tunable analog interpolation filter 302 in the place of the analog interpolation filter 206 of FIG. 2 and a tunable RF sample clock 312. The tunable interpolation filter 302 provides a tunable output frequency for the signal provided to the ADC 210. This ability to tune the interpolation filter is of particular usefulness when the interpolation filter bandwidth is significantly less than the Nyquist bandwidth of the high-speed non-quantizing sampler 204 or the bandwidth of the tunable/switchable filter 104. The tunable interpolation filter 302 may be tuned over the Nyquist bandwidth region for the high-speed non-quantizing sampler 204 instead of or in addition to fine-tuning through adjustments to the tunable RF sample clock 312. It is noted that with respect to FIG. 2B, the tunable interpolation filter would correspond to the ability to move the center frequency of filter response 252, 254, 256, . . . within the baseband and image Nyquist zones of operation for the non-quantizing RF sampler 204. It is also noted that the use of a selectable or tunable RF sampling clock signal is also discussed above with respect to the sampler 106 in FIG. 1.

FIG. 4 is a block diagram for a further example embodiment 400 of a reconfigurable direct RF bandpass sampling receiver with a tunable analog interpolation filter 302 and a tunable quantization sample clock 402 for the ADC 210. The addition of the tunable quantization sample clock 402 allows the ADC 210 to have a tunable sample rate that can be correlated to the tuning provided by the tunable analog interpolation filter 302. In operation, the embodiment 400 allows for a second-stage bandpass sampling down-conversion because the quantization sample clock signal to ADC 210 may be tunable and independent of the tunable high-speed RF sampling clock 312 for the non-quantizing RF sampler 204. This alternative embodiment 400 of a tunable ADC sample clock 402 in conjunction with a tunable interpolation filter 302 provides for significant flexibility in overall system operation, including the possibility of reducing the required tuning range of the first stage high-speed tunable sampling clock 312. It is noted that an architecture with second-stage tuning, for example, using the tunable ADC sample clock 402, can be generalized to a multiple stage solution. Second stage sampling can occur without quantization, for example, using a second interpolation filter and then quantizing at a later stage.

FIG. 5 is a block diagram for an example embodiment 500 of a reconfigurable direct RF bandpass sampling receiver with a multi-stage analog interpolation filter. As depicted, a first non-quantizing RF sampler 204A receives an input signal from the tunable bandpass filter 104 and receives an RF sampling clock signal from first stage tunable sample cock circuitry 502. The output of the first non-quantizing RF sampler 204A is pass through tunable interpolation filter 302 and then provided to the second non-quantizing RF sampler 204B. The second non-quantizing RF sampler 204B receives an RF sampling clock signal from second stage tunable sample clock circuitry 504 and outputs a signal to interpolation filter 206. The ADC 210 then receives and quantizes an output signal from the interpolation filter 206. It is noted that additional amplifiers could also be added after the interpolation filters 302 and 206, if desired.

The embodiments described herein for a reconfigurable direct RF bandpass sampling receiver using an analog interpolation filter can also be combined with and extend to other hybrid architectures. An example of one of these hybrid architectures is depicted with respect to FIG. 6. This unique and advantageous hybrid architecture includes bandpass sampling followed by an analog interpolation filter, which can configured to operate, for example, in the first Nyquist image of the bandpass sampler, followed by zero-IF down conversion.

Looking now to FIG. 6, a block diagram is depicted for an example embodiment 600 of a reconfigurable direct RF bandpass sampling receiver with a tunable bandpass analog interpolation filter and a zero-IF down-conversion backend. In particular, a bandpass sampling receiver stage 602, which includes the analog interpolation filter 302, is followed by a zero-IF down-conversion receiver stage 604. This hybrid architecture operates to generate baseband analog real (I) and imaginary (Q) output signals and then digital baseband I and Q signals as outputs that can be provided to digital signal processing (DSP) circuitry.

The bandpass sampling receiver stage 602 operates to receive the RF input signal 116 and to output analog interpolated signals at a desired intermediate frequency (IF). The RF input signal 116 is first processed with LNA 102 and tunable RF bandpass filter (BPF) 104. The signal is then provided to the non-quantizing RF sampler 204, which receives an RF sampling clock signal from tunable RF sample clock circuitry 312. A sampled signal is then output by the non-quantizing RF sampler 204 at a frequency that is determined by the sampling rate applied to the non-quantizing sampler 204. This sampled output signal is then provided to the tunable analog interpolation filter or tunable bandpass filter (BPF) interpolator 302. The output signal is then provided to a down-conversion receiver stage 604. This output signal will be at some desired intermediate frequency (IF) based upon the RF sampling rate and the operation of the analog interpolation filter 302. It is noted that in this architecture the analog interpolation filter can be tunable and operates as a bandpass filter that interpolates the signal.

The down-conversion receiver stage 604 operates to mix the interpolated analog signal down to baseband (DC or zero-IF). The input signal from the bandpass sampling receiver stage 602 is first processed by variable gain amplifier (VGA) 606. The signal is then provided to mixer 610 and mixer 616. The local oscillator (LO) generation circuitry 608 generates mixing signals for mixers 610 and 616 that are offset by 90 degrees (0/90), and the frequency of these mixing signals is selected through the use of a tuning select signal (IF Tune) signal. The IF Tune signal adjusts the mixing signals so that mixers 610 and 616 will mix the signal from the VGA 606 with the mixing signals from LO circuitry 608 to down-convert the signal directly to DC or zero-IF. As such, mixers 610 and 616 produce analog signals at baseband (DC or zero-IF) that are 90 degrees out of phase with each other. As depicted, the output of mixer 610 can represent the real signal path (I) and the output of the mixer 616 can represent the imaginary signal path (Q). These analog I and Q signals are then provided respectively to low pass filter (LPF) 612 and low pass filter (LPF) 618, which can each be adjusted in bandwidth and/or tuned in center frequency using a bandwidth (BW) select signal. The output of LPF 612 is then digitized by ADC 614 to generate a digital baseband real (I) signal, and the output of LPF 618 is digitized by ADC 620 to generate a digital baseband imaginary (Q) signal. The digital baseband I and Q signals can then be further processed by DSP circuitry, as discussed above with respect to FIG. 1. It is noted that the real (I) and imaginary (Q) path low pass filters (LPFs) 612 and 618 can be configured to have a reconfigurable or tunable bandwidth, and the ADCs 614 and 620 can be configured to have an adjustable sample rate according to a Nyquist criteria of the low pass filters (LPFs) 612 and 618.

By performing the quantization after an interpolation filter, the bandpass sampling receiver stage 602 allows for the use of a zero-IF receiver stage 604 with narrow bandwidth LPFs 612 and 618 as the final down-conversion stage. After the signal is down-converted to DC and filtered, low-power high-dynamic-range baseband ADCs 614 and 620 can be utilized. In operation, this hybrid architecture of FIG. 6 allows for significant power savings though lower ADC sample rates and relaxed ADC sample-and-hold requirements. In addition, this hybrid architecture takes advantages of zero-IF architecture benefits such as allowing for the possibility of a high degree of heterogeneous integration with variable gain amplifiers (VGAs) and bandwidth selectable low pass filters (LPFs). These VGA and LPF circuit blocks are frequently being integrated into zero-IF receivers on single integrated circuits and integrated circuit packages. Because zero-IF receivers typically do not go very low in frequency, the first Nyquist image (NZ1) can advantageously be used instead of the baseband Nyquist image (NZ0) after the high speed sampling of the RF signal.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. Receive path circuitry for a bandpass sampling receiver having decoupled quantization, comprising:
    bandpass filter circuitry having a center frequency within a frequency range of interest and having a bandwidth less than the frequency range of interest;
    non-quantizing sampling circuitry configured to receive a filtered signal from the bandpass filter circuitry and to receive a bandpass sampling clock signal as an input, the bandpass sampling clock signal meeting Nyquist sampling criteria of the bandpass filter but not meeting Nyquist sampling criteria of the total frequency range of interest;
    an analog interpolation filter coupled to receive the output of the non-quantizing sampling circuitry, the analog interpolation filter having a center frequency within a Nyquist zone of operation for the non-quantizing sampling circuitry; and
    analog to digital converter (ADC) circuitry configured to receive a quantization sampling clock signal and to quantize an analog signal received from the analog interpolation filter.

2. The receive path circuitry of claim 1, wherein the analog interpolation filter comprises tunable analog interpolation filter having a center frequency that is tunable within a Nyquist zone of operation for the non-quantizing sampling circuitry.

3. The receive path circuitry of claim 1, wherein the bandpass filter circuitry comprises tunable bandpass filter circuitry having a tunable center frequency dependent upon a filter control signal, the center frequency being tunable across the frequency range of interest.

4. The receive path circuitry of claim 1, wherein the analog interpolation filter comprises tunable analog interpolation filter having a center frequency that is tunable within a Nyquist zone of operation for the non-quantizing sampling circuitry, and wherein the bandpass filter circuitry comprises tunable bandpass filter circuitry having a tunable center frequency dependent upon a filter control signal, the center frequency being tunable across the frequency range of interest.

5. The receive path circuitry of claim 1, wherein the quantization sampling clock signal is tunable to determine a Nyquist zone of operation for the ADC.

6. The receive path circuitry of claim 1, further comprising clock generation circuitry coupled to provide the sampling clock signal to the non-quantizing sampling circuitry, the clock generation circuitry being configured to generate at least two selectable sampling clock signals, each sampling clock signal being configured to correspond to a different frequency so that Nyquist boundaries associated with the first sampling clock signal are different from the Nyquist boundaries associated with the second sampling clock signal.

7. The receive path circuitry of claim 6, wherein the first sampling clock signal is configured such that a plurality of Nyquist boundaries associated with the first sampling clock signal fall within the frequency range of interest, and wherein the second sampling clock signal is configured such that a plurality of Nyquist boundaries associated with the second sampling clock signal fall within the frequency range of interest.

8. The receive path circuitry of claim 7, wherein the clock generation circuitry is configured to select the second sampling clock signal when the bandwidth for the bandpass filter circuitry includes a Nyquist boundary for the first sampling clock signal.

9. The receive path circuitry of claim 1, further comprising:
    second non-quantizing sampling circuitry configured to receive a signal from the analog interpolation filter and to receive a second bandpass sampling clock signal as an input, the second bandpass sampling clock signal meeting Nyquist sampling criteria of the bandpass filter but not meeting Nyquist sampling criteria of the total frequency range of interest; and
    a second analog interpolation filter coupled to receive the output of the second non-quantizing sampling circuitry, the second analog interpolation filter having a center frequency within a Nyquist zone of operation for the second non-quantizing sampling circuitry;
    wherein the analog to digital converter (ADC) circuitry is configured to receive a quantization sampling clock signal and to quantize an analog signal received from the second analog interpolation filter.

10. The receive path circuitry of claim 9, further comprising additional stages of non-quantizing sampling circuitry and analog interpolation filter circuitry prior to the ADC circuitry.

11. The receive path circuitry of claim 1, where in the ADC circuitry comprises a zero-IF down-conversion circuitry configured to mix the signal from the analog interpolation filter down to baseband and to produce digital baseband real (I) and imaginary (Q) path signals.

12. The receive path circuitry of claim 11, wherein the zero-IF down-conversion circuitry further comprises real (I) and imaginary (Q) path reconfigurable low pass filters and real (I) and imaginary (Q) path analog to digital converters (ADCs).

13. The receive path circuitry of claim 11, wherein the analog interpolation filter circuitry comprises tunable analog interpolation filter circuitry having a center frequency that is tunable within a Nyquist zone of operation for the non-quantizing sampling circuitry; and wherein the bandpass filter circuitry comprises tunable bandpass filter circuitry having a tunable center frequency dependent upon a filter control signal, the center frequency is tunable across the frequency range of interest.

14. A method for direct sampling of signals, comprising:
   utilizing a bandpass filter to filter a signal within a frequency range of interest, the bandpass filter having a bandwidth less than the frequency range of interest;
   bandpass sampling a filtered signal from the bandpass filter circuitry without quantizing the signal according to a sampling clock signal that meets Nyquist criteria for the bandpass filter but does not meet Nyquist criteria for the total frequency range of interest;
   filtering the signal with an analog interpolation filter having a center frequency within a Nyquist zone of operation; and
   quantizing a signal received from the analog interpolation filter.

15. The method of claim 14, further comprising tuning a center frequency of the analog interpolation filter within a Nyquist zone of operation for the non-quantizing sampling circuitry.

16. The method of claim 14, further comprising tuning a center frequency of the bandpass filter circuitry across the frequency range of interest.

17. The method of claim 14, further comprising tuning a center frequency of the analog interpolation filter within a Nyquist zone of operation for the non-quantizing sampling circuitry, and tuning a center frequency of the bandpass filter circuitry across the frequency range of interest.

18. The method of claim 14, further comprising tuning the quantization sampling clock signal to determine a Nyquist zone of operation for the ADC.

19. The method of claim 14, further comprising generating at least two selectable sampling clock signals for the bandpass sampling, each sampling clock signal being configured to correspond to a different frequency so that Nyquist boundaries associated with the first sampling clock signal are different from the Nyquist boundaries associated with the second sampling clock signal.

20. The method of claim 19, further comprising configuring the first sampling clock signal such that a plurality of Nyquist boundaries associated with the first sampling clock signal fall within the frequency range of interest, and further comprising configuring the second sampling clock signal such that a plurality of Nyquist boundaries associated with the second sampling clock signal fall within the frequency range of interest.

21. The method of claim 20, further comprising selecting the second sampling clock signal when the bandwidth for the bandpass filter circuitry includes a Nyquist boundary for the first sampling clock signal.

22. The method of claim 14, further comprising:
   bandpass sampling the filtered signal from the analog interpolation filter without quantizing the signal according to a second sampling clock signal that meets Nyquist criteria for the bandpass filter but does not meet Nyquist criteria for the total frequency range of interest; and
   filtering the signal with a second analog interpolation filter having a center frequency within a Nyquist zone of operation prior to the quantizing step.

23. The method of claim 22, further steps of bandpass sampling without quantizing and filtering with analog interpolation filters prior to the quantizing step.

24. The method of claim 14, wherein the quantizing step comprises tuning the signal from the analog interpolation filter to zero-IF, generating analog baseband real (I) and imaginary (Q) path signals, and quantizing the analog baseband real (I) and imaginary (Q) path signals to produce digital baseband real (I) and imaginary (Q) path signals.

25. The method of claim 24, further comprising filtering the analog real (I) and imaginary (Q) path with reconfigurable low pass filters and digitizing real (I) and imaginary (Q) signals with analog to digital converters (ADCs).

26. The method of claim 24, further comprising tuning a center frequency of the analog interpolation filter within a Nyquist zone of operation for the non-quantizing sampling circuitry, tuning a center frequency of the bandpass filter circuitry across the frequency range of interest, and tuning the sampling clock signal.

* * * * *